(12) United States Patent
Ren et al.

(10) Patent No.: US 12,360,157 B2
(45) Date of Patent: Jul. 15, 2025

(54) SYSTEM AND METHOD FOR AUTOMATIC HEIGHT ADJUSTMENT FOR CHIP TESTING

(71) Applicant: Diodes Incorporated, Plano, TX (US)

(72) Inventors: Jie Ren, Chengdu (CN); Gan Yao, Chengdu (CN); Yu Liu, Chengdu (CN)

(73) Assignee: Diodes Incorporated, Plano, TX (US)

( * ) Notice: Subject to any disclaimer, the term of this patent is extended or adjusted under 35 U.S.C. 154(b) by 165 days.

(21) Appl. No.: 18/384,761

(22) Filed: Oct. 27, 2023

(65) Prior Publication Data

US 2024/0377455 A1 Nov. 14, 2024

Related U.S. Application Data

(63) Continuation of application No. PCT/CN2023/095980, filed on May 24, 2023.

(30) Foreign Application Priority Data

May 8, 2023 (CN) .......................... 2023105112642

(51) Int. Cl.
*G01R 31/28* (2006.01)
(52) U.S. Cl.
CPC ..... *G01R 31/2887* (2013.01); *G01R 31/2896* (2013.01)
(58) Field of Classification Search
CPC .............. G01R 1/0416; G01R 1/06727; G01R 31/2868; G01R 31/2893; G01R 31/2896
See application file for complete search history.

(56) References Cited

U.S. PATENT DOCUMENTS

| | | | | |
|---|---|---|---|---|
| 9,625,520 B2 * | 4/2017 | Wang | ................. | G01R 31/2853 |
| 2009/0302875 A1 * | 12/2009 | Lu | ....................... | G01R 31/2886 |
| | | | | 324/762.06 |
| 2015/0276799 A1 | 10/2015 | Weimer | | |
| 2020/0041552 A1 | 2/2020 | Lai | | |

FOREIGN PATENT DOCUMENTS

| | | |
|---|---|---|
| CN | 103293503 A | 9/2013 |
| CN | 106093584 A | 11/2016 |
| TW | 201329483 A | 7/2013 |
| TW | 202316117 A | 4/2023 |

OTHER PUBLICATIONS

Office Action and Search Report from Taiwan Patent Application No. 113104025, dated Aug. 29, 2024, 11 pages.

* cited by examiner

*Primary Examiner* — Tung X Nguyen
(74) *Attorney, Agent, or Firm* — AP3 Law Firm PLLC; Hong Zou

(57) ABSTRACT

A method includes configuring a preset reference pulse number, and controlling a test contact piece for testing chip leads to move toward a target chip lead, using a control signal corresponding to the preset reference pulse number. First data is continuously obtained and used to determine whether the test contact piece is in contact with the target chip lead. When the test contact piece is in contact with the target chip lead, the test contact piece is controlled to stop moving. Second data is obtained characterizing movement of the test contact piece from a time when the test contact piece initially contacts the target chip lead to a time when the test contact piece stops moving. The preset reference pulse number is adjusted based on the second data. A system and device, and a computer-readable storage medium are also provided for implementing the method.

23 Claims, 9 Drawing Sheets

| IC Lead No. | 1 | 2 | 3 | 4 | 5 | 6 | 7 |
|---|---|---|---|---|---|---|---|
| Test condition | I=10mA | I=10mA | I=10mA | I=10mA | I=10mA | I=10mA | I=10mA |
| LSL | 0 | 0 | 0 | 0 | 0 | 0 | 0 |
| USL | 5Ω | 5Ω | 5Ω | 5Ω | 5Ω | 5Ω | 5Ω |
| Pass | 2.881 | 2.558 | 2.558 | 2.667 | 2.558 | 2.803 | 2.608 |
| Fail | 2.567 | 2.572 | 2.612 | 8.956 | 2.626 | 2.749 | 2.558 |

↑ Height Pass  ↑ Height Fail

FIG. 4

SYSTEM AND METHOD FOR AUTOMATIC HEIGHT ADJUSTMENT FOR CHIP TESTING

CROSS-REFERENCE TO RELATED APPLICATIONS

This patent application is a continuation of International Application No. PCT/CN2023/095980, filed on May 24, 2023 and entitled "Automatic height adjustment method for chip testing and related components," which claims priority to Chinese Application No. 2023105112642, filed on May 8, 2023 and entitled "Automatic height adjustment method for chip testing and related components." The aforementioned applications are hereby incorporated by reference herein as if reproduced in their entireties.

TECHNICAL FIELD

The present disclosure relates to the field of chip testing, and more particularly, to a system and method for automatic height adjustment method for chip testing.

BACKGROUND

A series of tests are required after a chip is packaged, and usually, a testing system may need to be debugged/adjusted before the tests are performed, especially after the test environment changes. For example, the test location may have changed compared to the location of the previous test, especially the location of a base where the chip under test is placed. For another example, after components in the testing system have been maintained, repaired, or replaced with new consumables, the testing system may need to be debugged/adjusted. Generally, when adjusting the height, the chip may be manually fixed on a test bench, and a motor is used to control a mechanical arm and test pins thereof to move down or up, to test and adjust the distance between the test pins and lead of the chip, so as to put the test pins at a height required for a test before the test is started.

However, in the art, it is usually the engineers at the work site who adjust the height of the test pins based on experience. The adjusting process is complicated and limited by experience. It is hard to guarantee the adjusting effect, and the adjusting efficiency is also low. In addition, when the test bench is used in a special environment, e.g., in a high-temperature and sealed environment, there may be an unobservable blind zone for testing. Relying on the above experience-based adjusting method may very likely cause occurrence excessive contact between the test pins and the chip leads, resulting in damage to a semiconductor device and deformation of the chip leads, or cause occurrence of poor contact between the test pins and the chip leads. These situations will affect the subsequent experiments. Taking the occurrence of poor contact as an example, in case of large test current, sparkling may occur causing safety concerns, which may also cause personnels working under high temperature conditions to get burned easily, posing a safety hazard.

Therefore, how to provide a solution to the above technical problems is a problem to be solved currently by technical people in the art.

SUMMARY

Technical advantages are generally achieved, by embodiments of this disclosure which describe a system and method for automatic height adjustment method for chip testing.

An objective of the present disclosure is to provide an automatic height adjustment method for chip testing and related components thereof. This solution provides a higher degree of automation, is more conducive to performing contact adjustment under high-temperature working conditions, and can avoid personnels from getting burned. The solution also avoids, as much as possible, the occurrence of excessive contact or poor contact between test pins and chip leads, reduces the quality risk faced in adjustment, provides higher adjusting effect and efficiency, and is beneficial to practical application in production.

In order to solve the above described technical problems, embodiments of the present disclosure provide an automatic height adjustment method, which is applied in a chip testing system. The chip testing system includes a control module connected to a test module and a power module. The power module is connected to a driving component that is connected to a test contact piece in the test module. The automatic height adjustment method includes: setting a preset reference pulse number; sending a control signal corresponding to the preset reference pulse number to a power module, to cause the power module to control, based on the control signal, a driving component to move, such that the driving component drives the test contact piece in the test module to move; continuously obtaining first characteristic data fed back by the test module, the first characteristic data characterizing whether there is contact between the test contact piece and a target chip lead of a to-be-tested device; determining, based on the first characteristic data, whether the test contact piece and the target chip lead are in contact with each other; when the test contact piece and the target chip lead are in contact with each other, sending a stop signal to the power module to control, through the power module, the driving component to stop moving, to cause the test contact piece to stop moving; obtaining second characteristic data characterizing movement of the test contact piece from a time when the test contact piece initially contacts the target chip lead to a time when the test contact piece stops moving; and adjusting the preset reference pulse number based on the second characteristic data to obtain a new preset reference pulses number.

Further, the test module includes a constant current supply module and a voltage acquisition module, wherein an output terminal of the constant current supply module is grounded through the test contact piece, and the constant current supply module is configured to output a constant current signal. The voltage acquisition module and the test contact piece are connected in parallel. Continuously obtaining the first characteristic data fed back by the test module includes: continuously obtaining the voltage collected by the voltage acquisition module, wherein the voltage has a first voltage value when the test contact piece is in contact with the target chip lead, and the voltage has a second voltage value when the test contact piece is not in contact with the target chip lead.

Further, the test contact piece includes a first finger and a second finger, wherein one terminal of the first finger is connected to an output terminal of the constant current supply module and a first input terminal of the voltage acquisition module, one terminal of the second finger is connected to a second input terminal of the voltage acquisition module and grounded; the other terminal of the first finger and the other terminal of the second finger are both used to connect to the target chip lead, and are not in contact with each other. Determining, based on the first characteristic data, that the test contact piece and the target chip lead are in contact includes: determining whether the voltage fed back by the voltage acquisition module is 0; and when the voltage is not 0, determining that the test contact piece and the target chip lead are in contact with each other.

Further, the first finger and the second finger include a first conductive component, an elastically extendable component and a second conductive component connected in sequence.

Further, after controlling, through the power module, the driving component to stop moving to cause the test contact piece to stop moving, the automatic height adjustment method further includes: based on the voltage fed back by the voltage acquisition module, determining a contact resistance corresponding to a target contact portion when the test contact piece is in contact with the target chip lead; determining whether the contact resistance is smaller than a preset resistance threshold; and when the contact resistance is smaller than the preset resistance threshold, determining that the target chip lead is a lead that passes a height adjustment test.

Further, the automatic height adjustment method includes: determining whether each chip lead of the to-be-test device is a lead that passes the height adjustment test; if each chip lead passes the height adjustment test, determining that the to-be-test device passes the height adjustment test; and if not, determining that the to-be-test device fails the height adjustment test.

Further, the automatic height adjustment method includes: determining whether a cumulative number of uses of the test contact device reaches a preset test threshold; if the cumulative number reaches the preset test threshold, controlling a notification module to output prompt information prompting to replace the test contact piece.

Further, the test contact piece is an extendable contact piece. Obtaining the second characteristic data characterizing the movement of the test contact piece starting from the time when the test contact piece initially contacts the target chip lead to the time when the test contact piece stops moving includes: obtaining a number of redundant pulses that is run by the power module and corresponds to a target distance, wherein the target distance is a distance shortened by the test contact piece starting from the time when the test contact piece initially contacts the target chip lead to the time when the test contact piece stops moving. Adjusting the preset reference pulse number based on the second characteristic data to obtain the new preset reference pulses number includes: adjusting the preset reference pulse number based on the number of redundant pulses to obtain the new preset reference pulse number.

In order to solve the technical problems above, embodiments of the present disclosure also provide a chip testing system including a control module, a test module, a power module and a driving component; the control module is connected to the test module and the power module, the power module is connected to the driving component, and the driving component is connected to a test contact piece in the test module. The test module is configured to feed back first characteristic data, wherein the first characteristic data characterizes a contact state between the test contact piece and a target chip lead of a to-be-tested device. The power module is configured to control, based on a control signal sent by the control module, the driving component to move, and to control, based on a stop signal sent by the control module, the driving component to stop moving. The driving component is configured to drive the test contact piece to move when it is moving, and to cause the test contact piece to stop moving when it stops moving. The control module is configured to set a preset reference pulse number, and send the control signal corresponding to the preset reference pulse number to the power module; to continuously obtain the first characteristic data, and to send the stop signal to the power module when determining, based on the first characteristic data, that the test contact piece is in contact with the target chip lead; to obtain second characteristic data characterizing movement of the test contact piece starting from a time when the test contact piece comes into contact with the target chip lead to a time when the test contact piece stops moving, to adjust, based on the second characteristic data, the preset reference pulse number to obtain a new preset reference pulse number.

Further, the test module includes a constant current supply module and a voltage acquisition module, wherein an output terminal of the constant current supply module is grounded through the test contact piece, and the constant current supply module is configured to output a constant current signal. The voltage acquisition module is connected in parallel with the test contact piece. The voltage acquisition module is configured to collect voltage and feedback the voltage to the control module as the first characteristic data. The voltage has a first voltage value when the test contact piece is in contact with the target chip lead, and has a second voltage value when the test contact piece is not in contact with the target chip lead.

Further, the test contact includes a first finger and a second contact piece. One terminal of the first finger is connected to an output terminal of the constant current supply module and a first input terminal of the voltage acquisition module. One terminal of the second finger is connected to a second input terminal of the voltage acquisition module and grounded. The other terminal of the first finger and the other terminal of the second finger are both configured to connect to the target chip lead, and are not in contact with each other. The control module is configured to set the preset reference pulse number, and send the control signal corresponding to the preset reference pulse number to the power module; to continuously obtain the voltage collected by the voltage acquisition module, and send the stop signal to the power module when determining that the voltage is not 0; to obtain the second characteristic data representing the movement of the test contact piece from the time when the test contact piece initially contacts the target chip lead to the time when the test contact piece stops moving, in order to adjust the preset reference pulse number based on the second characteristic data to obtain the new preset reference pulse number.

Further, the first finger and the second finger include a first conductive member, an elastically extendable component and a second conductive component connected in sequence.

Further, the control module is configured to determine a contact resistance corresponding to a target contact portion when the test contact piece is in contact with the target chip lead, based on the voltage fed back by the voltage acquisition module, and when determining that the contact resistance is smaller than a preset resistance threshold, determining that the target chip lead is a lead that passes a height adjustment test.

Further, the control module is configured to determine whether each chip lead of the to-be-tested device is a lead that passes the height adjustment test; if yes, determine that the to-be-tested device passes the height adjustment test; and if not, determine that the to-be-tested device does not pass the height adjustment test.

Further, the control module is configured to determine whether a cumulative number of use of the test contact piece reaches a preset test threshold; and if yes, to control a notification module to output prompt information prompting to replace the test contact piece.

Further, the control module is configured to set the preset reference pulse number, send the control signal corresponding to the preset reference pulse number to the power module; to continuously obtain the first characteristic data, and send the stop signal to the power module when determining, based on the first characteristic data, that the test contact piece is in contact with the target chip lead; to obtain a number of redundant pulses run by the power module corresponding to a target distance, to adjust the preset reference pulse number based on the number of redundant pulses to obtain the new preset reference pulse number, wherein the target distance is a distance shortened by the test contact piece starting from the time when the test contact piece initially contacts the target chip lead to the time when the test contact piece stops moving.

In order to solve the above described technical problems, embodiments of the present disclosure further provide a non-transitory computer-readable storage medium, wherein the computer computer-readable storage medium includes a computer program, which when executed by a processor, is configured to perform steps of the automatic height adjustment method for chip testing as described above.

In order to solve the above described technical problems, embodiments of the present disclosure also provide a control device including: a non-transitory memory configured to store a computer program; and a processor configured to perform steps of the automatic height adjustment method for chip testing as described above when executing the computer program.

According to one aspect of the present disclosure, a method is provided that includes: configuring a preset reference pulse number; controlling a test contact piece to move using a control signal corresponding to a value of the preset reference pulse number, the test contact piece being for testing chip leads; continuously obtaining first data indicating whether the test contact piece is in contact with a target chip lead of a to-be-tested device; determining, based on the first data, that the test contact piece is in contact with the target chip lead, and based thereon, controlling the test contact piece to stop moving; obtaining second data characterizing movement of the test contact piece from a time when the test contact piece comes into contact with the target chip lead to a time when the test contact piece stops moving; and adjusting the value of the preset reference pulse number based on the second data to obtain a new value of the preset reference pulse number.

According to another aspect of the present disclosure, a device is provided that includes: a non-transitory memory storing a computer program; and a processor, configured to execute the computer program to cause the device to perform: configuring a value of a preset reference pulse number; controlling a test contact piece to move using a control signal corresponding to the value of the preset reference pulse number, the test contact piece being for testing chip leads; continuously obtaining first data indicating whether the test contact piece is in contact with a target chip lead of a to-be-tested device; determining, based on the first data, that the test contact piece is in contact with the target chip lead, and based thereon, controlling the test contact piece to stop moving; obtaining second data characterizing movement of the test contact piece from a time when the test contact piece initially contacts the target chip lead to a time when the test contact piece stops moving; and adjusting the value of the preset reference pulse number based on the second data to obtain a new value of the preset reference pulse number.

According to another aspect of the present disclosure, a chip testing system is provided that includes: a control module, a test module, a power module and a driving component, the control module being connected to the test module and the power module, the power module being connected to the driving component, and the driving component being connected to a test contact piece of the test module. The test module is configured to feedback first data to the control module, the first data indicating whether the test contact piece is in contact with a target chip lead of a to-be-tested device. The power module is configured to control, based on a control signal sent by the control module, the driving component to move, and to control, based on a stop signal sent by the control module, the driving component to stop moving. The driving component is configured to cause the test contact piece to move when the driving component moves, and to cause the test contact piece to stop moving when the driving component stops moving. The control module is configured to set a preset reference pulse number, and send the control signal corresponding to the preset reference pulse number to the power module; to continuously obtain the first data, and send the stop signal to the power module when determining, based on the first data, that the test contact piece is in contact with the target chip lead; to obtain second data characterizing movement of the test contact piece starting from a time when the test contact piece comes into contact with the target chip lead to a time when the test contact piece stops moving, to adjust, based on the second data, a value of the preset reference pulse number to obtain a new value of the preset reference pulse number.

Embodiments of the present disclosure provide an automatic height adjustment method for chip testing and related components thereof. In the solution, the preset reference pulse number is configured, and the control signal corresponding to the preset reference pulse number is sent to the power module, to cause the power module to control, based on the control signal, the driving component to move, which further causes the test contact piece to move. The first characteristic data fed back by the test module may be continuously obtained to realize continuous monitoring, where the first characteristic data characterizes whether the test contact piece and the target chip lead of the to-be-tested device are in contact. When determining, based on first characteristic data, that the test contact piece and the target chip lead are in contact with each other, the stop signal is sent to control, by the power module, the driving component to stop moving, so as to cause the test contact piece to stop moving. The second characteristic data is obtained, based on which the preset reference pulse number is adjusted. This further ensures the reliable implementation of the automatic height adjustment method. Compared with the conventional method in the art where adjustment is performed by experience-based engineers, the solution of the embodiments of the present disclosure provides a higher degree of automation, and is more conducive to realizing contact adjustment under high-temperature working conditions, preventing personnels performing the adjustment from getting burned. It further avoids, as much as possible, occurrence of excessive contact or poor contact between the test pin and the chip leads, reduces the quality risk in adjustment, improves adjustment efficient and effect, and is more conducive to practical application in production.

BRIEF DESCRIPTION OF THE DRAWINGS

In order to more clearly illustrate the technical solutions in embodiments of the present disclosure, drawings to be used in relative technologies and the embodiments of the present disclosure are briefly described in the following. Obviously, the drawings in the following description are only some embodiments of the disclosure, and those ordinarily skilled in the art may also obtain other drawings based on these drawings without taking creative efforts.

The technical solutions and beneficial effects of the present disclosure will be made apparent through the detailed description of embodiments of the present disclosure in conjunction with the accompanying drawings, in which:

FIG. 4 is table showing example height adjustment results according to embodiments of the present disclosure;

The same or similar components are labeled with the same reference numerals in the drawings and detailed description. Embodiments of the present disclosure will be readily understood from the following detailed description taken in conjunction with the accompanying drawings.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Embodiments of the present disclosure provide an automatic height adjustment method for chip testing and related components thereof. The solutions provide a higher degree of automation, are more conducive to performing contact adjustment under high-temperature working conditions, and can prevent personnels from getting burned. The solutions also avoid, as much as possible, occurrence of excessive contact or poor contact between test pins and chip leads, reduce the quality risk faced in adjustment, provide higher adjusting effect and efficiency, and are beneficial to practical application in production.

In order to make the objectives, technical solutions and advantages of the embodiments of the present disclosure clearer, the technical solutions in the embodiments of the present disclosure will be clearly and completely described below with reference to the drawings in the embodiments of the present disclosure. Obviously, the described embodiments are some, rather than all, embodiments of the present disclosure. Based on the embodiments of the present disclosure, all other embodiments obtained by those of ordinary skill in the art without creative efforts fall within the protection scope of the present disclosure.

Figure 1:
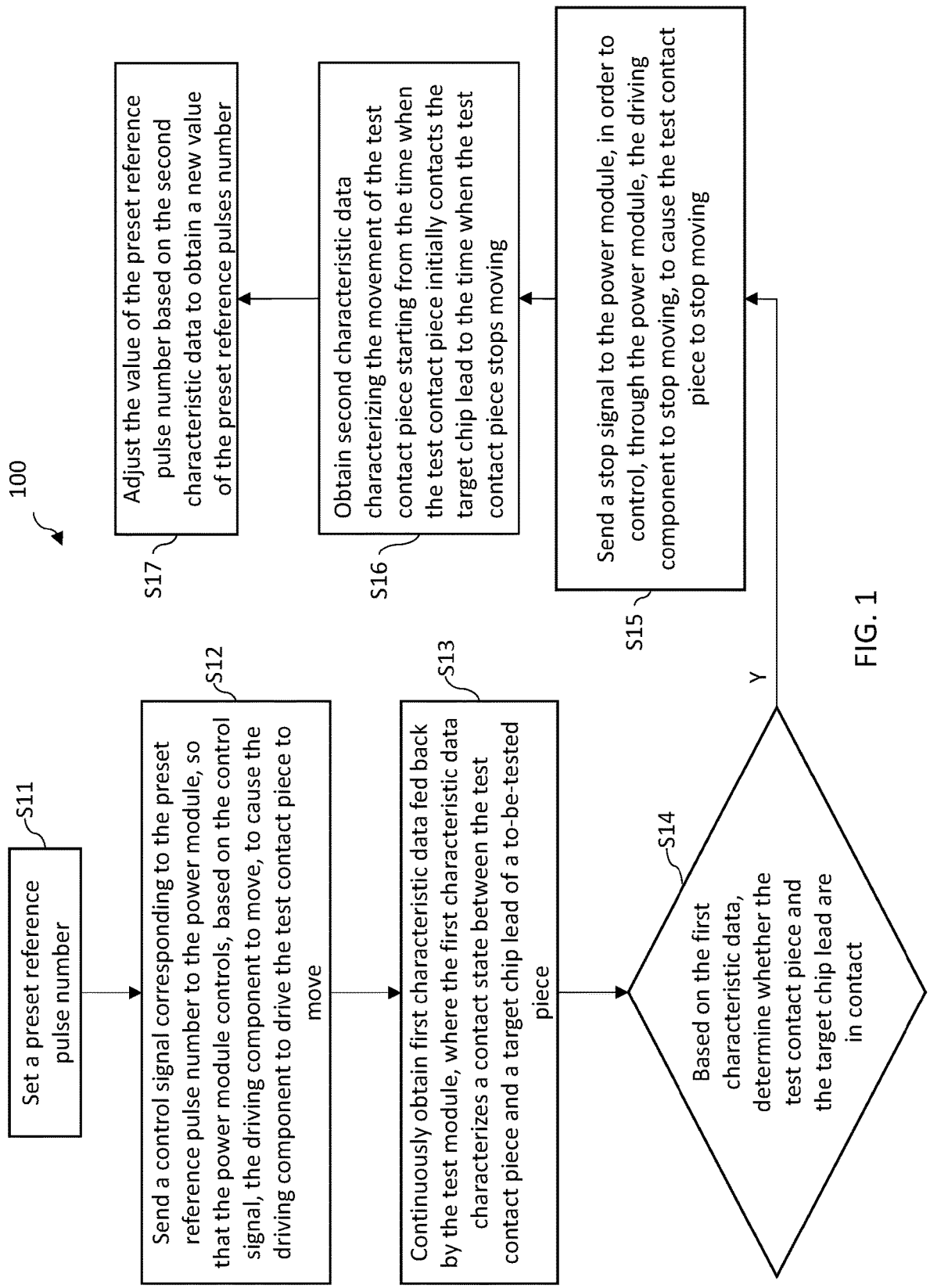
FIG. 1 is a flowchart of an automatic height adjustment method for chip testing according to embodiments of the present disclosure.

Referring to FIG. 1, FIG. 1 is a flowchart of a contact adjustment method 100 according to embodiments of the present disclosure.

In this embodiment, a situation in the art is considered where the height of a test pin is usually adjusted by engineers at the work site based on experience. The adjusting process is complicated and very limited by the engineers' experience. The adjusting effect is difficult to guarantee and the adjusting efficiency is also low. Moreover, due to the existence of an unobservable adjusting blind area, effective visual adjustment cannot be performed. Thus, excessive or poor contact between the test pins and the chip leads may occur easily, causing safety issues and affecting subsequent experiments. In order to solve these technical problems, embodiments of the present disclosure provide a contact adjustment method, which has a high degree of automation and is more conducive to practical application in production. The contact adjustment method may also be referred to as an automatic height adjustment method for chip testing.

Figure 6:
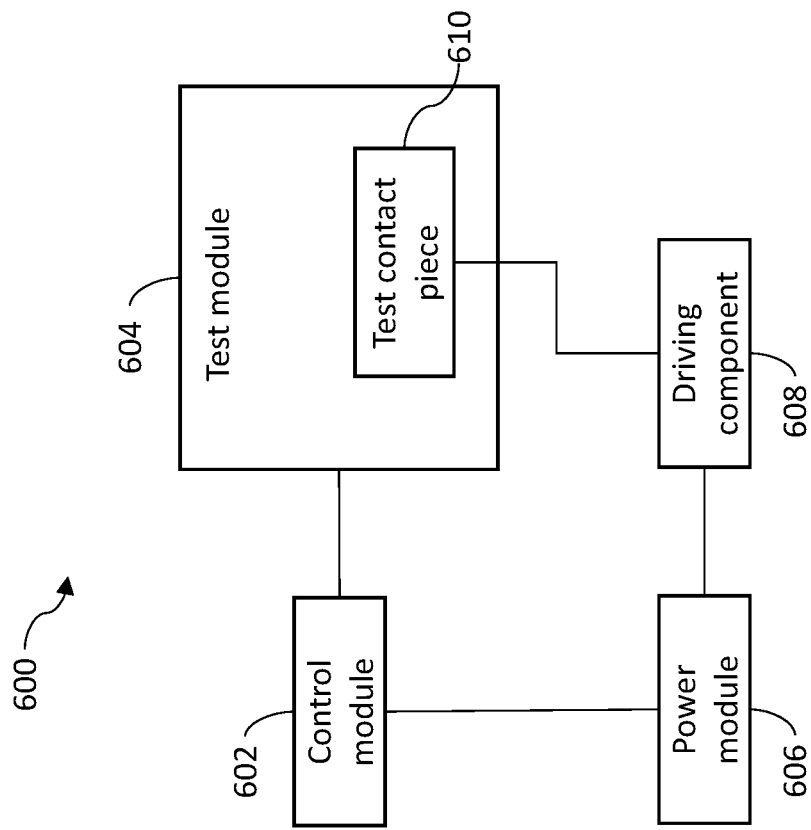
FIG. 6 is a schematic diagram of an example chip testing system according to embodiments of the present disclosure.

The automatic height adjustment method for chip testing may be applied to a chip testing system. FIG. 6 is a diagram of an embodiment chip testing system 600. The chip testing system 600 may include a control module 602 connected to a test module (or tester) 604 and a power module 606. The power module 606 may be connected to a driving component 608. The driving component 608 may be connected to a test contact piece/device 610 in the test module 604. An example automatic height adjustment method for chip testing may include the following actions/steps, as shown FIG. 1.

S11: Set a preset reference pulse number.

S12: Send a control signal corresponding to the preset reference pulse number to the power module 606, so that the power module 606 controls, based on the control signal, the driving component 608 to move, to cause the driving component 608 to drive the test contact piece 610 to move.

S13: Continuously obtain first characteristic data fed back by the test module 604, where the first characteristic data characterizes a contact state between the test contact piece 610 and a target chip lead of a to-be-tested piece/device. The terms of "piece" and "device" may be used herein interchangeably. The first characteristic data may indicate whether the test contact piece 610 is in contact with the target chip lead of the to-be-tested piece/device.

It should be noted that the automatic height adjustment method for chip testing may be specifically applied to test each chip lead(s) of the to-be-tested piece, where the to-be-tested piece includes, but is not limited to, a semiconductor device that is manufactured and to be tested. In embodiments of the present disclosure, the height adjustment refers to adjusting the position of the test contact piece so that the test contact piece is in reliable contact with the target chip lead of the to-be-tested piece. The control module 602 may specifically include, but is not limited to, a tester storing software program(s) corresponding to embodiment method(s) of the present disclosure. The power module 606 may specifically include, but is not limited to, a servo motor. A control terminal of the servo motor may be connected to the control module 602 to receive the control signal sent by the control module 602. The driving component 608 may include, but is not limited to, a robotic arm, which is connected to the test contact piece 610, such that the test contact piece 610 moves with the movement of the robotic arm. It can be understood that the to-be-tested piece may be specifically placed on a test bench (the process of placing the to-be-tested piece on the test bench may also be performed by a robotic arm, that is, the robotic arm may pick a to-be-tested piece from multiple to-be-tested pieces and set it on the test bench, which enables personnels to achieve non-contact operation and prevents them from getting burned in a high-temperature working environment). The robotic arm, the test contact piece and the to-be-teste piece may be specifically set up in a sealed high-temperature test box. During the test, the temperature in the sealed high-temperature test box may be adjusted according to actual test requirements, e.g., up to 170 degrees Celsius. There may be a visually blind zone in a product test area corresponding to the to-be-teste piece, but the working area of the robotic arm may cover any position of the product test area.

Figure 2A:
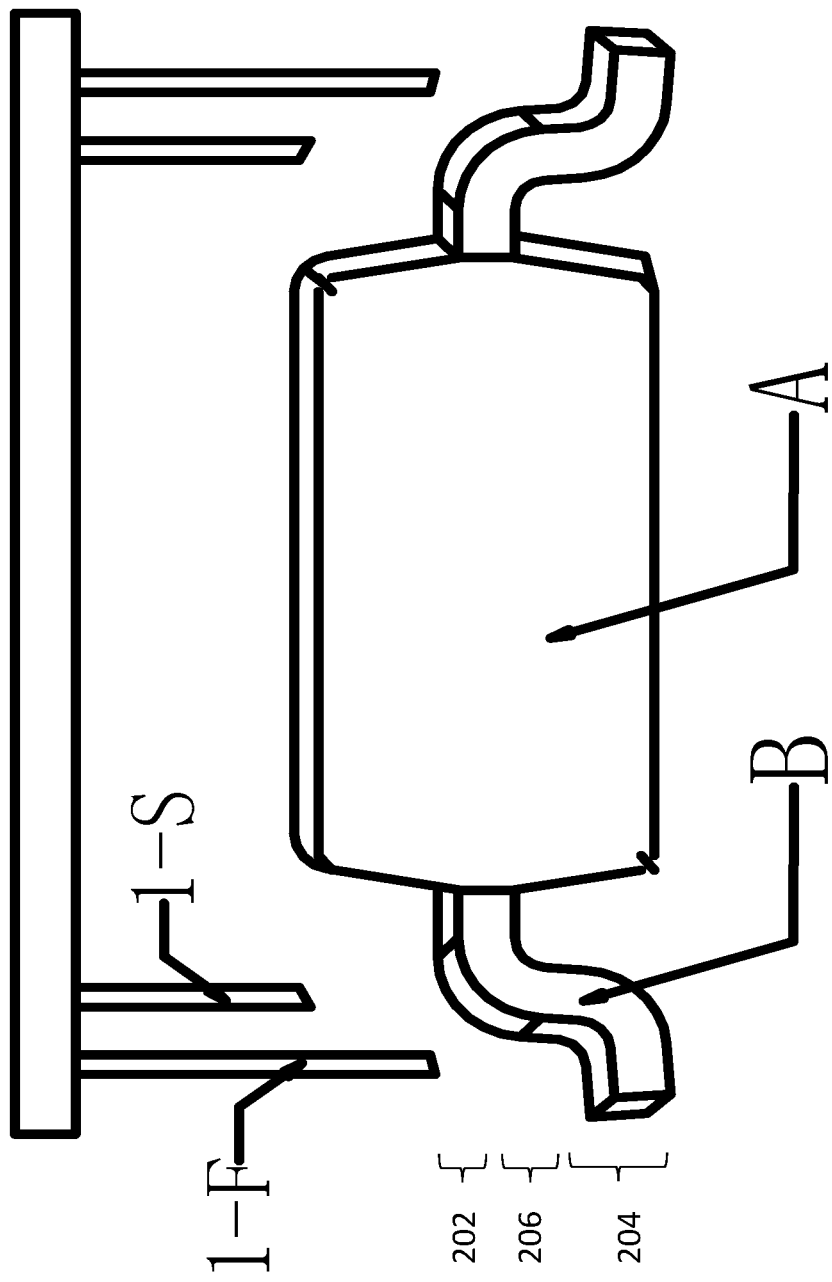
FIG. 2A, FIG. 2B and FIG. 2C are schematic diagrams showing an example moving process of a test contact piece according to embodiments of the present disclosure.
Figure 2B:
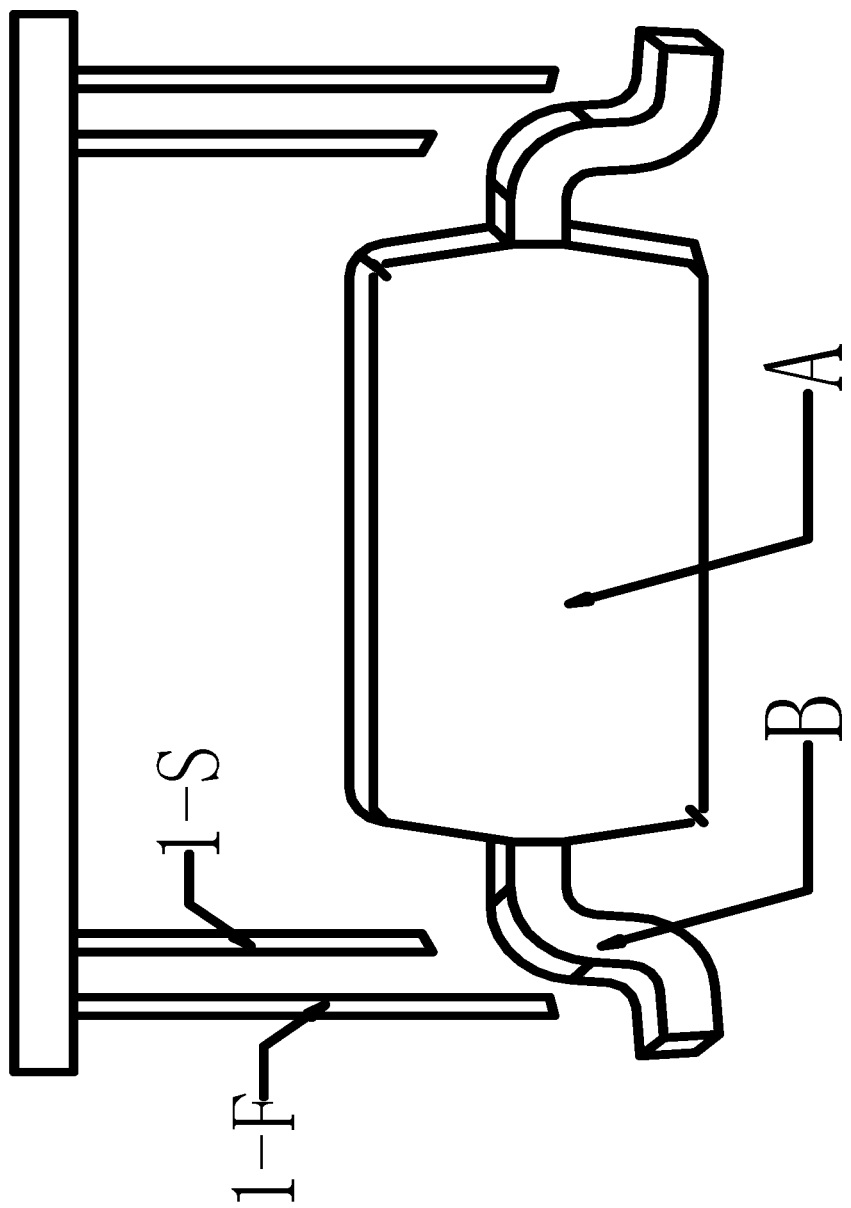
Figure 2C:
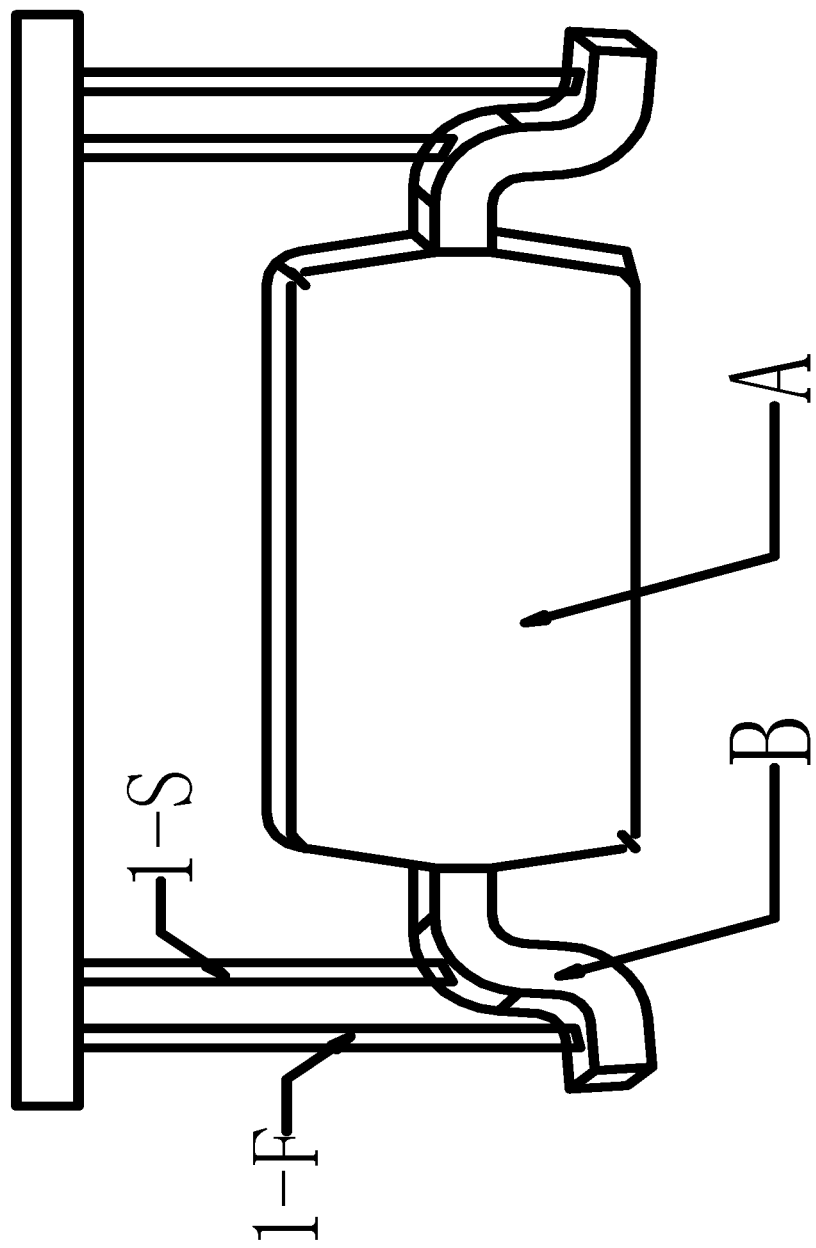

First, in some embodiments, the specific value of the preset reference pulse number is not particularly limited here. For example, a value of the preset reference pulse number may be 100 standard pulses. It was found out in actual tests that the equivalent displacement distance of 100 standard pulses is approximately 0.014 mm, which, as a result, causes the test contact piece, driven by the driving component, to continuously move from an original stagnation position to the position of a target chip lead (where the target chip lead is any one of multiple chip leads of the to-be-tested piece). Referring to FIG. 2A, FIG. 2B and FIG. 2C, FIG. 2A is a schematic diagram of an example moving process of a test contact piece according to embodiments of the present disclosure. FIG. 2B is a schematic diagram of another example moving process of the test contact piece according to embodiments of the present disclosure. FIG. 2C is a schematic diagram of yet another example moving process of the test contact piece according to embodiments of the present disclosure. In the three figures, the test contact piece including a first contact piece (also referred to as a finger thereafter) 1-F and a second contact piece or finger 1-S is used as an example for illustration. The to-be-tested piece is represented by A, and the target chip lead is represented by B as shown. FIGS. 2A, 2B and 2C show a process where the test contact piece (e.g., fingers 1-F and 1-S) gradually approaches the target chip lead B of the to-be-tested piece A, and finally contacts the target chip lead B, as seen from FIG. 2A to FIG. 2B and to FIG. 2C. Thus, the test contact piece is controlled to move toward the target chip lead based on the value of the preset reference pulse number.

Second, one or more values may be configured for the preset reference pulse number. When multiple values are configured for the preset reference pulse number, the automatic height adjustment method for chip testing may also include the following steps. That is, based on a distance detection module of the chip testing system, the current distance between the test contact piece and the target chip lead may be determined. Based on the determined distance, one value of the preset reference pulse number may be selected from the multiple values as a target value of the preset reference pulse number. A control signal corresponding to the target value of the preset reference pulse number may be generated and sent to the power module. The distance detection module may be an infrared distance detection device designed based on the principle of infrared ranging, or may be a radar detector, which is not specifically limited hereto, and may be determined according to actual needs.

S14: Based on first characteristic data, determine whether the test contact piece 610 and the target chip lead are in contact; and if yes, proceed to S15.

S15: Send a stop signal to the power module 606, in order to control, through the power module 606, the driving component 608 to stop moving, to cause the test contact piece 610 to stop moving.

S16: Obtain second characteristic data characterizing the movement of the test contact piece 610 starting from the time when the test contact piece initially contacts the target chip lead to the time when the test contact piece stops moving.

That is, the test contact piece is caused to move toward the target chip lead, and when the test contact piece comes in contact with the target chip lead, the test contact piece initially contacts the target chip lead. The test contact piece may continue move toward the target chip lead until the driving component stop moving, causing the test contact piece to stop.

S17: Adjust the value of the preset reference pulse number based on the second characteristic data to obtain a new value of the preset reference pulses number.

It should be noted that during the execution of step S12, steps S13 and S14 may be executed simultaneously to provide continuous monitoring of the adjusting process of the height, so that different steps may be executed in a timely manner based on the adjusting situation. More specifically, the first characteristic data represents the contact situation between the test contact piece and the target chip lead of the to-be-tested piece. The first characteristic data may indicate whether the test contact piece is in contact with the target chip lead of the to-be-tested piece. Based on the first characteristic data, whether the test contact piece and the target chip lead are in contact may be determined. When determining that the test contact piece and the target chip lead are not in contact, the test contact piece may be caused to continue to approach toward the target chip lead, and a contact state between the two is continuously monitored. When determining that the test contact piece and the target chip lead are in contact, step S15 may be executed immediately to send the stop signal. The power module then stops power output, the driving component stops moving, and the test contact piece stops moving to avoid excessive contact between the test contact piece and the target chip lead. Considering that the test contact piece may continue to move a short distance starting from the time when the test contact piece comes into contact with the target chip lead to the time when it stops moving, in order to improve the control accuracy of the automatic height adjustment method of this disclosure, the second characteristic data may be obtained, and the value of the preset reference pulse number may be adjusted based on the obtained second characteristic data for subsequent use.

It can be understood that the automatic height adjustment method provided in the embodiments of the present disclosure is basically for a height adjustment before the chip testing is performed. After the test contact piece is in reliable contact with the target chip lead, subsequent electrical parameter tests can be performed, which is not particularly limited.

In view of above, the embodiments of the present disclosure provide an automatic height adjustment method for chip testing. Compared with the conventional method in the art where adjustment is performed by engineers based on experience, the solution of the embodiments of the present disclosure provides a higher degree of automation and is more conducive to realizing contact adjustment under high-temperature working conditions. It prevents personnels performing the adjustment from getting burned, and lowers the requirements on experience and skills of personnels performing the adjustment. It further avoids, as much as possible, occurrence of excessive contact or poor contact between the test pins and the chip leads, reduces the quality risk in adjustment, improves adjustment efficient and effect, and is more conducive to practical application in production.

The following is further provided based on the above embodiments.

Figure 7:
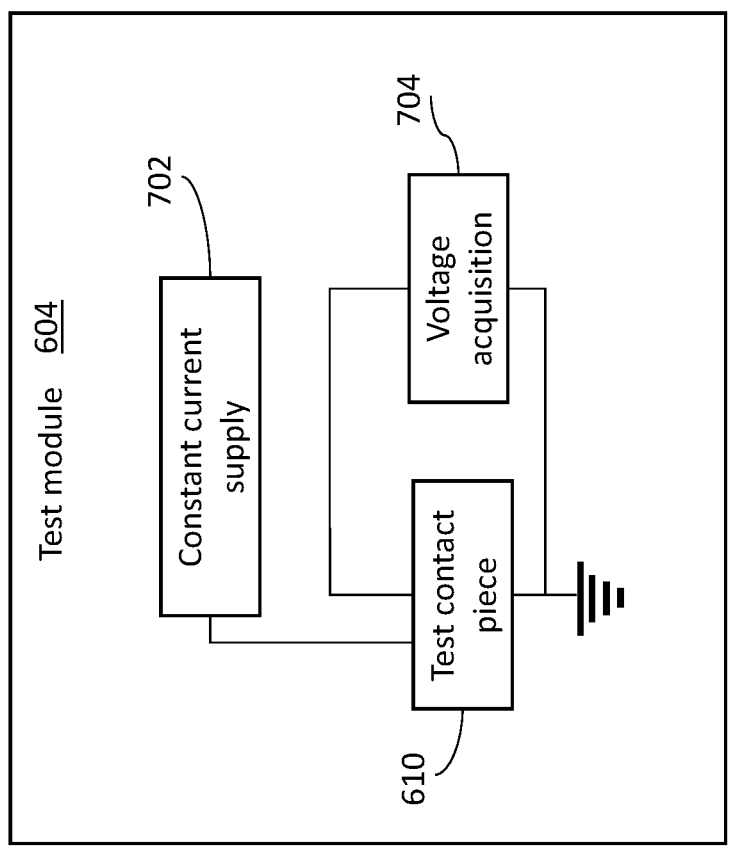
FIG. 7 is a schematic diagram of an example test module according to embodiments of the present disclosure.

In some embodiments, the test module 604 as described with respect to FIG. 6 may include a constant current supply module 702 and a voltage acquisition module 704, as shown in FIG. 7. FIG. 7 is a diagram of an example of the test module 604 according to one embodiment of the present disclosure. The constant current supply module 702 has an output terminal that is grounded through the test contact piece 610, and the constant current supply module 702 is used to output a constant current signal. The voltage acquisition module 704 and the test contact piece 610 may be connected in parallel.

Continuously obtaining the first characteristic data fed back by the test module 604 may include: continuously obtaining the voltage collected by the voltage acquisition module 704. The voltage has a first voltage value when the test contact piece 610 is in contact with the target chip lead. The voltage has a second voltage value when the test contact piece 610 is not in contact with the target chip lead.

In these embodiments, the test module may include the constant current supply module and the voltage acquisition module. The constant current supply module may include, but is not limited to, a constant current source, and is used for outputting a constant current signal based on a requirement. The voltage acquisition module may include, but is not limited to, a voltmeter that can feed back the collected voltage information, or a voltage acquisition circuit composed of other circuits/devices, which is not specifically limited hereto.

It can be understood that based on the circuit connection manner and circuit structure, when the test contact piece is not in contact with the target chip lead, the voltage collected by the voltage acquisition module has the first voltage value. When the test contact piece is in contact with the target chip lead, the corresponding resistance changes, which causes the voltage collected by the voltage acquisition module to have the second voltage value. The first voltage value and the second voltage value are different voltage values, based on which whether the test contact piece is in contact with the target chip lead can be determined.

Figure 8:
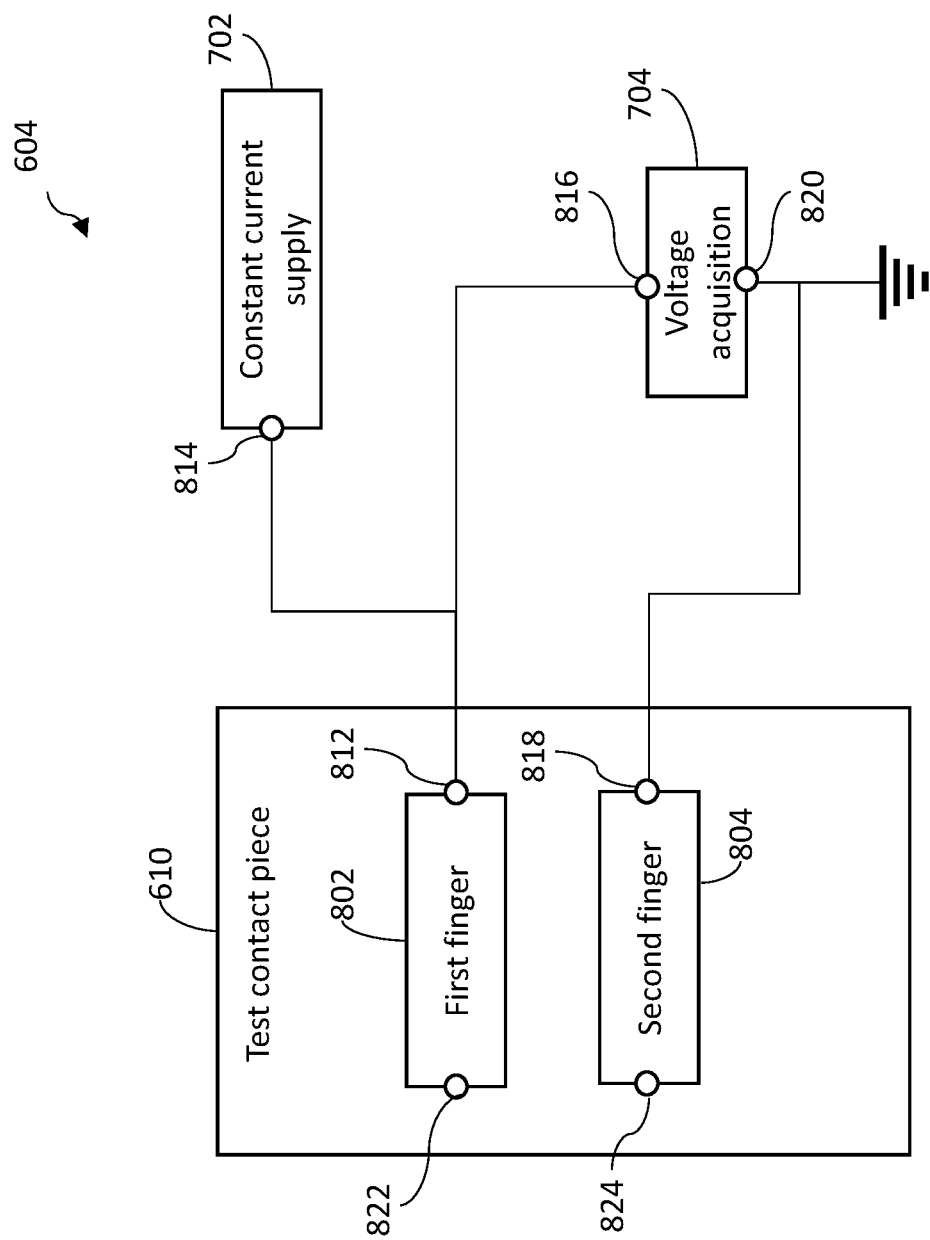
FIG. 8 is a schematic diagram of another example test module according to embodiments of the present disclosure.

In some embodiments, the test contact piece 610 as described with respect to FIG. 6 may include a first finger and a second contact piece. FIG. 8 is a diagram of another example of the test module 604 according to embodiments of the present disclosure. The test module 604 includes the contact piece 610 including a first finger 802 and a second finger 804. One terminal 812 of the first finger 802 may be connected to an output terminal 814 of the constant current supply module 702 and a first input terminal 816 of the voltage acquisition module 704. One terminal 818 of the second finger 804 may be connected to a second input terminal 820 of the voltage acquisition module 704 and then grounded. The other terminal 822 of the first finger 802 and the other terminal 824 of the second finger 804 are both used to connect to the target chip lead. The terminal 822 and the terminal 824 are not in contact with each other.

Determining, based on the first characteristic data, that the test contact piece 610 and the target chip lead are in contact may include: determining whether the voltage fed back by the voltage acquisition module 704 is 0; and if the voltage is not 0, determining that the test contact piece 610 and the target chip lead are in contact with each other.

Figure 3:
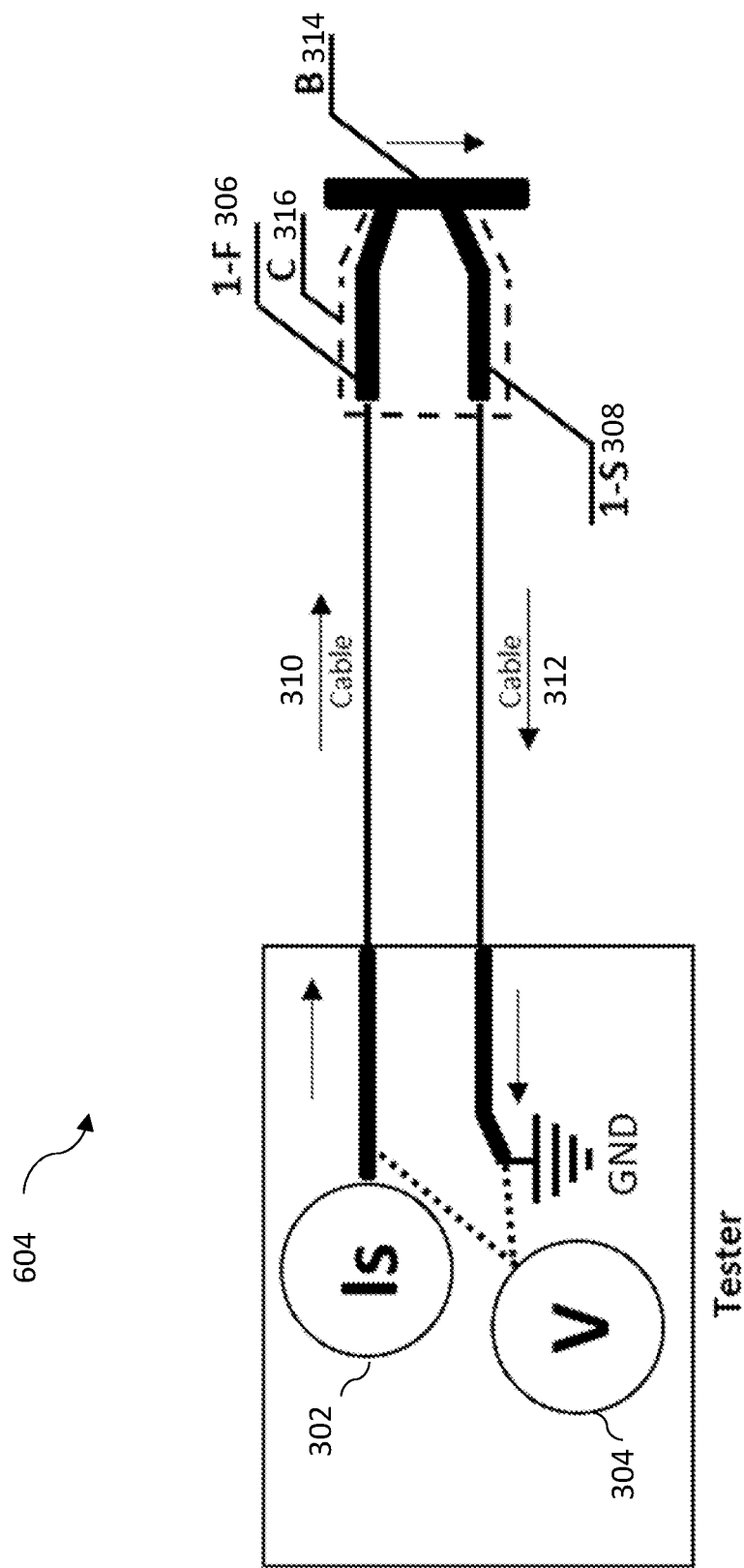
FIG. 3 is a schematic diagram showing principle for adjusting height between a test contact piece and a target chip lead according to embodiments of the present disclosure.

In these embodiments, the test contact piece may include a first finger and a second contact piece. Referring to FIG. 3, FIG. 3 is a schematic diagram showing the principle for height adjustment between a test contact piece and a target chip lead according to embodiments of the present disclosure. FIG. 3 shows another example of the text module 604. In FIG. 3, a current source 302 (Is) with a constant current output is used as the constant current supply module, a voltmeter 304 (V) that can feedback collected voltage information is used as the voltage acquisition module, a test pin or finger 1-F 306 is used as the first contact piece, and a test pin 1-S 308 is used as the second contact piece, as examples for illustration. Specifically, an output terminal of the current source 302 may be connected to the test pin or finger 1-F 306 (e.g., at terminal 812 of the test pin 306) through a cable 310. The connection between the test pin 1-S 308 (e.g., at terminal 818 of the test pin 308) and the voltmeter 304 may also be achieved by a cable 312. The other terminal (e.g., terminal 822) of the test pin 1-F 306 does not contact the other terminal (e.g., terminal 824) of the test pin 1-S 308. According to the circuit principle, when the test contact piece is not in contact with a target chip lead B 314, no current path is formed, and the voltage collected and fed back by the voltage acquisition module, i.e., the voltmeter 304, is 0 (that is, the first voltage value as mentioned above is 0). When the test contact piece is in contact with the target chip lead B 314, the test pin 1-F 306 and the test pin 1-S 308 are connected through a portion (referred to as a contact path portion thereafter), forming a current path, where the contact path portion includes a portion of the target chip lead B 314 between two respective terminals of the test pin 1-F 306 and the test pin 1-S 308 that are in contact with the target chip lead B 314, and also includes the two respective terminals of the test pin 1-F 306 and the test pin 1-S 308. The voltage collected and fed back by the voltage acquisition module, i.e., the voltmeter 304, has a non-zero value (that is, the second voltage value mentioned above is a non-zero value), based on which it is determined that the test contact piece (i.e., 306 and 308) and the target chip lead B 314 are in contact.

The above embodiment method can be used to easily and reliably determine whether the test contact piece and the target chip lead are in contact. Further, configuring the test contact piece as including the first finger and the second finger is conducive to subsequent testing of other electrical parameters and to practical applications.

In some embodiments, after controlling, through the power module, the driving component to stop moving to cause the test contact piece to stop moving, the automatic height adjustment method may include: based on the voltage fed back by the voltage acquisition module, determining the contact resistance corresponding to a target contact portion (i.e., a portion C 316 in FIG. 3 marked by a dashed-line) when the test contact piece is in contact with the target chip lead; determining whether the contact resistance is smaller than a preset resistance threshold; and when the contact resistance is smaller than the preset resistance threshold, determining that the target chip lead is a lead that has passed a height adjustment test. The target contact portion C 316 may include the lead B 314, and the test pins 1-F and 1-S.

This embodiment provides an execution logic for determining whether the target chip lead is a lead that passes the height adjustment test, after determining that the test contact piece is in reliable contact with the target chip lead. Specifically, referring to FIG. 3, the test pin 1-F 306 is connected to the test pin 1-S 308 through the contact path portion, forming a current path. The voltage fed back by the voltage acquisition module has a non-zero voltage value (i.e., the second voltage value). Based on the Ohm's law, since the current output by the constant current source is constant, the total resistance of the entire current path can be determined. The resistance of the cables is also fixed, and thus the resistance of the contact resistance corresponding to the target contact portion C 316 can be determined.

It should also be noted that the specific value of the preset resistance threshold is not particularly limited here, e.g., the preset resistance threshold may be 5Ω, which may be set according to actual needs.

In some embodiments, the automatic height adjustment method may include: determining whether each chip lead of the to-be-test piece is a lead that has passed the height adjustment test; if each chip lead has passed the height adjustment test, determining that the to-be-test piece passes the height adjustment test; if not, e.g., at least one chip lead has failed the height adjustment test, determining that the to-be-test piece fails the height adjustment test.

In this embodiment, considering that a to-be-test piece includes multiple chip leads, each chip lead is used as a target chip lead for height adjustment. Therefore, only when each chip lead is a lead that has passed the height adjustment test, it is determined that the to-be-test piece has passed the height adjustment test; otherwise, it is determined that the to-be-test piece has failed the height adjustment. Further description is given in an illustrative example where a constant current source is used as the constant current supply module with an output current of 10 mA and a preset resistance threshold is 5Ω. The to-be-test device has multiple chip leads. Referring to FIG. 4, FIG. 4 is a schematic diagram showing example height adjustment results according to embodiments of the present disclosure. FIG. 4 uses a table 400 to show the height adjustment results. In this example, the upper specification limit (USL) is the preset resistance threshold, the lower specification limit (LSL) is 0 (the resistance value must be a positive number), the IC lead number represents the number of each chip lead, and 7 chip leads are used as an example. Two to-be-test pieces each having 7 chip leads are tested. The fifth row of table 400 shows the resistance values of the contact resistors of the 7 chip leads of a first to-be-test piece, and the sixth row of table 400 shows the resistance values of the contact resistors of the 7 chip leads of a second to-be-test piece. It can be seen from the items indicated as height pass (corresponding to the first to-be-test piece), i.e., the fifth row of table 400, the resistance values of the contact resistors corresponding to the 7 chip leads are all smaller than the preset resistance threshold 5Ω, and as a result, the first to-be-test piece passes the height adjustment test. For the items indicated as height fail (corresponding to the second to-be-test piece), i.e., the sixth row of table 400, in the resistance values of the 7 chip leads, the resistance value corresponding to the 4th chip lead is 8.956Ω, which is greater than the preset resistance threshold. Therefore, the second to-be-test piece fails to pass the height adjustment test.

In some embodiments, the automatic height adjustment method may further include: determining whether a cumulative number of uses of the test contact piece reaches a preset test threshold; if the cumulative number of uses reaches the preset test threshold, controlling a notification module to output prompt information indicating to replace the test contact piece. In this embodiment, considering that the test contact piece may have problems such as aging with the number of uses increases, which affects the contact adjustment, the service life of the test contact piece may be monitored. That is, each time after the test contact piece is used to test a target chip lead using the above described automatic height adjustment method, its corresponding cumulative number of uses is increased by 1. Based on the accumulation, whether the cumulative number of uses of the test contact piece has reached the preset test threshold is determined. No special limitation is made herein to the specific value of the preset test threshold, and the preset test threshold may be set according to actual needs.

When the cumulative number of uses of the test contact piece has reached the preset test threshold, the notification module may be controlled to output prompt information, to prompt adjustment personnels to replace the test contact piece, in order to avoid affecting the test results. The specific manner of prompting is not particularly limited, and it may include, but is not limited to, displaying, voice broadcasting, sending emails or text messages, and so on. When the cumulative number of uses of the test contact piece has not reached the preset test threshold, the test contact piece may continue to be used and monitored.

In some embodiments, the first finger and the second finger include a first conductive component, an elastically extendable component and a second conductive component connected in sequence.

In this embodiment, in order to further ensure that the test contact piece has a certain contact elasticity, the first finger and the second finger may be designed in the following manner. That is, the test contact piece includes a first conductive component, an elastically extendable component and a second conductive component connected in sequence. The elastically extendable component may include, but not limited to, a spring. The first conductive member and the second conductive member may be made of conductive materials and are not specifically limited here. The above embodiment may further be used to avoid as much as possible the test contact piece from damaging target leads during the contact with the target leads.

In some embodiments, the test contact piece may be an extendable contact piece. Obtaining the second characteristic data characterizing the movement of the test contact piece starting from the time when the test contact piece initially contacts the target chip lead to the time when the test contact piece stops moving may include: obtaining a number of redundant pulses that is run by the power module and corresponds to a target distance. The target distance is the distance shortened/moved by the test contact piece starting from the time when the test contact piece initially contacts the target chip lead to the time when the test contact piece stops moving. Adjusting the value of the preset reference pulse number based on the second characteristic data to obtain a new value of the preset reference pulse number may include: correcting/adjusting the value of the preset reference pulse number based on the number of redundant pulses to obtain a new value of the preset reference pulse number.

In this embodiment, in order to further improve the adjustment accuracy of the solution, it is considered that even though the process of determining and issuing instructions is very fast, the test contact piece may still be shortened by a certain distance, e.g., the target distance, starting from the time when the test contact piece comes into contact with the target chip lead, to the time when the test contact piece finally stops moving. The target distance corresponds to the number of redundant pulses run by the power module, e.g., the servo motor. Therefore, the value of the preset reference pulse number may be adjusted based on the number of redundant pulses. Based on control of feedback of the data, a new preset reference pulse number may be obtained. Calibration and adjustment of the preset reference pulse number may help ensure, as much as possible, the accuracy of the contact adjustment process, and further avoid excessive contact between the test contact piece and the target chip leads, which avoids damage of the target chip leads, and is beneficial to practical applications in production.

It can be understood that the test contact piece is an extendable contact piece, and its specific structure can have the elastically extendable design of the first finger and the second finger as described in the above embodiments.

In addition, taking the power module being a servo motor as an example, a servo encoder may be included to accurately determine the number of pulses run by the servo motor. Therefore, the number of redundant pulses run by the power module and corresponding to the target distance may be obtained based on the feedback of the servo encoder.

Embodiments of the present disclosure also provide a chip testing system, as described above. The chip testing system includes a control module, a test module, a power module and a driving component. The control module is connected to the test module and the power module, the power module is connected to the driving component, and the driving component is also connected to a test contact piece in the test module. The test module is configured to feed back the first characteristic data. The first characteristic data characterizes the contact between the test contact piece and a target chip lead of a to-be-tested device. The power module is configured to control, based on a control signal sent by the control module, the driving component to move, and to control, based on a stop signal sent by the control module, the driving component to stop moving. The driving component is configured to drive the test contact piece to move when it moves, and to cause the test contact piece to stop moving when it stops moving. The control module is configured to set a preset reference pulse number, and send the control signal corresponding to the preset reference pulse number to the power module; to continuously obtain the first characteristic data, and to send the stop signal to the power module when determining, based on the first characteristic data, that the test contact piece is in contact with the target chip lead; to obtain second characteristic data characterizing the movement of the test contact piece starting from the time when the test contact piece comes into contact with the target chip lead to the time when the test contact piece stops moving, and adjust the value of the preset reference pulse number to obtain a new value of the preset reference pulse number based on the second characteristic data.

For the description of the chip testing system of the embodiments of the present disclosure, please refer to the embodiment automatic height adjustment method for chip testing described above, which is not repeated here.

In some embodiments, the test module includes a constant current supply module and a voltage acquisition module. The constant current supply module has an output terminal that is grounded through the test contact piece, and is configured to output a constant current signal. The voltage acquisition module is connected in parallel with the test contact piece. The voltage acquisition module is configured to collect voltage and feed back the voltage to the control module as the first characteristic data. The voltage has a first voltage value when the test contact piece is in contact with the target chip lead, and has a second voltage value when the test contact piece is not in contact with the target chip lead.

In some embodiments, the test contact includes a first finger and a second contact piece. One terminal of the first finger is connected to an output terminal of the constant current supply module and a first input terminal of the voltage acquisition module. One terminal of the second finger is connected to a second input terminal of the voltage acquisition module and then grounded. The other terminal of the first finger and the other terminal of the second finger are both configured to connect to the target chip lead, and are not in contact with each other.

The control module is specifically configured to set the preset reference pulse number, and send the control signal corresponding to the preset reference pulse number to the power module; to continuously obtain the voltage collected by the voltage acquisition module, and send the stop signal to the power module when determining that the voltage is not 0; to obtain the second characteristic data representing the movement of the test contact piece from the time when the test contact piece initially contacts the target chip lead to the time when the test contact piece stops moving, in order to adjust the value of the preset reference pulse number based on the second characteristic data to obtain a new value of the preset reference pulse number.

In some embodiments, the first finger and the second finger include a first conductive member, an elastically extendable component and a second conductive component connected in sequence.

In some embodiments, the control module is also configured to determine a contact resistance corresponding to a target contact portion when the test contact piece is in contact with the target chip lead, based on the voltage fed back by the voltage acquisition module, and when determining that the contact resistance is smaller than a preset resistance threshold, determining that the target chip lead is a lead that has passed a height adjustment test.

In some embodiments, the control module is further configured to determine whether each chip lead of the to-be-tested piece is a lead that has passed the height adjustment test; if yes, determine that the to-be-tested device passes the height adjustment test; if not, determine that the to-be-tested device does not pass the height adjustment test.

In some embodiments, the control module is further configured to determine whether a cumulative number of uses of the test contact piece reaches a preset test threshold; if yes, to control a notification module to output prompt information prompting to replace the test contact piece.

In some embodiments, the control module is specifically configured to set a preset reference pulse number, send a control signal corresponding to the preset reference pulse number to the power module; to continuously obtain first characteristic data, and send a stop signal to the power module when determining, based on the first characteristic data, that the test contact piece is in contact with the target chip lead; to obtain a number of redundant pulses run by the power module corresponding to a target distance, to adjust the value of the preset reference pulse number based on the number of redundant pulses to obtain a new value of the preset reference pulse number, where the target distance is a distance shortened by the test contact piece starting from the time when the test contact piece initially contacts the target chip lead to the time when the test contact piece stops moving.

Embodiments of the present disclosure also provide a non-transitory computer-readable storage medium, which includes a computer program stored on the computer-readable storage medium, and when the computer program is executed by a processor, the steps of the automatic height adjustment method for chip testing as described above are performed.

For description of the computer-readable storage medium provided by the embodiments of the present disclosure, please refer to the embodiment automatic height adjustment method for chip testing described above, which is not repeated here.

Figure 5:
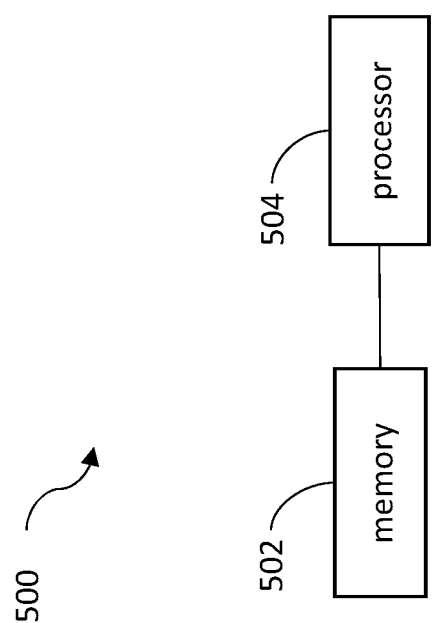
FIG. 5 is a schematic structural diagram of an example control device according to embodiments of the present disclosure.

Referring to FIG. 5, FIG. 5 is a schematic diagram of an example control device 500 according to embodiments of the present disclosure. The control device 500 includes: a memory 502, configured to store a computer program; and a processor 504, configured to implement the steps of the automatic height adjustment method for chip testing as described above when executing the computer program. The memory 502 may include a non-transitory computer readable medium.

For description of the control device 500 provided by the embodiments of the present disclosure, please refer to the embodiment automatic height adjustment method for chip testing described above, which is not repeated here.

Embodiments of the present disclosure may be applied to various to-be-tested pieces/devices, e.g., an assembled chip, a small outline package (SOP), a small outline integrated circuit (SOIC), a small outline (SO), a shrink small outline package (SSOPP), a small outline transistor (SOT), and so on. A to-be-tested device may have a plurality of leads. The leads of the to-be-tested device may have an L shape, a gull wing shape or a curved shape. As an example, referring to FIG. 2A, the lead B of the to-be-tested piece A extends out from the to-be-tested piece A, bends down and then extends out again. Specifically, as an example, the lead B of the to-be-tested piece A may include an upper portion 202 protruding out from the to-be-tested piece A, a lower portion 204, and a middle portion 206 (which may be a curved portion) connecting the upper portion 202 and the lower portion 204. With such a shape, a surface of the lead B that is to be in contact with a finger, e.g., the finger 1-S, may be a sloped surface, and thus, the terminal of the finger 1-S that is to be in contact with the lead B needs to have a matching sloped surface. As an example shown in FIGS. 2A-2C, the terminals of the fingers 1-F and 1-S that are to be in contact with the lead B have sloped bottom surfaces matching respectively surfaces of the lead B where the fingers 1-F and 1-S contact the lead B. The terminal surface of a finger may be configured to match a lead surface at a contact location where the finger will be in contact with the lead. Further, since the fingers may land on different contact locations of a lead, lengths of the fingers for testing the lead may be different. As shown in FIGS. 2A-2C, finger 1-F may be longer than finger 1-S, as finger 1-F will land on the lower portion of the lead B and finger 1-S will land on the upper portion of the lead B.

Embodiments in the disclosure are described in a progressive manner, each embodiment is described to mainly include the differences from other embodiments, and the same and similar aspects of the embodiments can be referred to each other. As devices disclosed in the embodiments correspond to the methods disclosed in the embodiments, the devices are described in a relatively simple way. For the related aspects, please refer to the corresponding description of the methods. Relational terms, such as first, second, and so on, are only used to distinguish one entity or operation from another entity or operation, and do not necessarily require or imply that any actual relationship or order exists between these entities or operations. Furthermore, the term "include", "comprise", or any other variations thereof is intended to cover a non-exclusive inclusion, such that a process, method, article, or a device including a set of elements not only includes those elements, but also includes other elements not expressly listed, or also includes elements inherent in such a process, method, article, or device. Without further limitations, an element limited by the phrase "include a . . . " does not exclude the presence of additional identical elements in the process, method, article or device including said element.

Those ordinarily skilled in the art may further appreciate that units and algorithm steps of each example according to the embodiments of the present disclosure may be implemented by use of electronic hardware, computer software, or a combination thereof. In order to clearly illustrate the interchangeability of hardware and software, the composition and steps of each example have been generally described in the above description according to functions. Whether these functions are performed in hardware or software depends on the specific applications and design constraints of the technical solution. Those ordinarily skilled in the art may implement the described functions using different methods for each specific application, but such implementations should not be considered to be beyond the scope of the present disclosure. Various modifications to these embodiments will be readily apparent to those skilled in the art, and the general principles defined herein may be implemented in other embodiments without departing from the spirit or scope of the present disclosure. Therefore, the present disclosure is not to be limited to the embodiments shown herein, but is to be accorded the widest scope consistent with the principles and novel features disclosed herein.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method comprising:
configuring a preset reference pulse number;
controlling a test contact piece to move using a control signal corresponding to a value of the preset reference pulse number, the test contact piece being for testing chip leads;
continuously obtaining first data indicating whether the test contact piece is in contact with a target chip lead of a to-be-tested device;
determining, based on the first data, that the test contact piece is in contact with the target chip lead, and based thereon, controlling the test contact piece to stop moving;
obtaining second data characterizing movement of the test contact piece from a time when the test contact piece comes into contact with the target chip lead to a time when the test contact piece stops moving; and adjusting the value of the preset reference pulse number based on the second data to obtain a new value of the preset reference pulse number.

2. The method of claim 1, wherein continuously obtaining the first data comprises:
continuously obtaining a voltage of the test contact piece, the voltage having a first value when the test contact piece is in contact with the target chip lead, and having a second value when the test contact piece is not in contact with the target chip lead.

3. The method of claim 2, wherein determining, based on the first data, that the test contact piece is in contact with the target chip lead comprises:
determining whether the voltage of the test contact piece is zero (0); and
when the voltage of the test contact piece is not zero (0), determining that the test contact piece is in contact with the target chip lead.

4. The method of claim 2, further comprising: after controlling the test contact piece to stop moving,
determining, based on the voltage of the test contact piece, a resistance corresponding to a target contact portion of the test contact piece when the test contact piece is in contact with the target chip lead;
determining whether the resistance is smaller than a preset resistance threshold; and
when the resistance is smaller than the preset resistance threshold, determining that the target chip lead passes a height test.

5. The method of claim 4, further comprising:
determining whether each chip lead of the to-be-tested device passes the height test;
when each chip lead of the to-be-tested device passes the height test, determining that the to-be-tested device passes the height test; and
when at least one chip lead of the to-be-tested device fails the height test, determining that the to-be-tested device fails the height test.

6. The method of claim 1, further comprising:
determining whether a number of uses of the test contact piece reaches a preset threshold;
in response to the number of uses of the test contact piece reaching the preset threshold, prompting to replace the test contact piece.

7. The method of claim 1, wherein,
obtaining the second data comprises:
obtaining a number of redundant pulses corresponding to a target distance, the target distance being a distance moved by the test contact piece starting from the time when the test contact piece comes into contact with the target chip lead to the time when the test contact piece stops moving; and
adjusting the value of the preset reference pulse number comprises:
adjusting the value of the preset reference pulse number based on the number of redundant pulses to obtain the new value of the preset reference pulse number.

8. The method of claim 1, wherein the target chip lead has an L shape, gull wing shape or a curved shape.

9. A device comprising:
a non-transitory memory storing a computer program; and
a processor, configured to execute the computer program to cause the device to perform:
configuring a value of a preset reference pulse number;
controlling a test contact piece to move using a control signal corresponding to the value of the preset reference pulse number, the test contact piece being for testing chip leads;
continuously obtaining first data indicating whether the test contact piece is in contact with a target chip lead of a to-be-tested device;
determining, based on the first data, that the test contact piece is in contact with the target chip lead, and based thereon, controlling the test contact piece to stop moving;
obtaining second data characterizing movement of the test contact piece from a time when the test contact piece initially contacts the target chip lead to a time when the test contact piece stops moving; and
adjusting the value of the preset reference pulse number based on the second data to obtain a new value of the preset reference pulse number.

10. The device of claim 9, wherein continuously obtaining the first data comprises:
continuously obtaining a voltage of the test contact piece, the voltage having a first value when the test contact piece is in contact with the target chip lead, and having a second value when the test contact piece is not in contact with the target chip lead.

11. The device of claim 10, wherein determining, based on the first data, that the test contact piece is in contact with the target chip lead comprises:
determining whether the voltage of the test contact piece is zero (0); and
when the voltage of the test contact piece is not zero (0), determining that the test contact piece is in contact with the target chip lead.

12. The device of claim 10, wherein controlling the test contact piece to stop moving comprises:
determining, based on the voltage of the test contact piece, a resistance corresponding to a target contact portion of the test contact piece when the test contact piece is in contact with the target chip lead;
determining whether the resistance is smaller than a preset resistance threshold; and
when the resistance is smaller than the preset resistance threshold, determining that the target chip lead passes a height test.

13. The device of claim 12, wherein the device is further caused to perform:
determining whether each chip lead of the to-be-tested device passes the height test;
when each chip lead of the to-be-tested device passes the height test, determining that the to-be-tested device passes the height test; and
when at least one chip lead of the to-be-tested device fails the height test, determining that the to-be-tested device fails the height test.

14. The device of claim 9, wherein the device is further caused to perform:
determining whether a number of uses of the test contact piece reaches a preset threshold;
in response to the number of uses of the test contact piece reaching the preset threshold, prompting to replace the test contact piece.

15. The device of claim 9, wherein,
obtaining the second data comprises:
obtaining a number of redundant pulses corresponding to a target distance, the target distance being a distance moved by the test contact piece starting from the time when the test contact piece initially contacts the target chip lead to the time when the test contact piece stops moving; and adjusting the value of the preset reference pulse number comprises:
adjusting the value of the preset reference pulse number based on the number of redundant pulses to obtain the new value of the preset reference pulses number.

16. The device of claim 9, wherein the target chip lead has an L shape, gull wing shape or a curved shape.

17. A non-transitory computer-readable storage medium storing a computer program, which, when executed by one or more processors, causes a device to perform the method of claim 1.

18. A chip testing system, comprising:
a control module, a test module, a power module and a driving component, the control module being connected to the test module and the power module, the power module being connected to the driving component, and the driving component being connected to a test contact piece of the test module; and
wherein,
the test module is configured to feedback first data to the control module, the first data indicating whether the test contact piece is in contact with a target chip lead of a to-be-tested device;
the power module is configured to control, based on a control signal sent by the control module, the driving component to move, and to control, based on a stop signal sent by the control module, the driving component to stop moving;
the driving component is configured to cause the test contact piece to move when the driving component moves, and to cause the test contact piece to stop moving when the driving component stops moving;
the control module is configured to set a preset reference pulse number, and send the control signal corresponding to the preset reference pulse number to the power module; to continuously obtain the first data, and send the stop signal to the power module when determining, based on the first data, that the test contact piece is in contact with the target chip lead; to obtain second data characterizing movement of the test contact piece starting from a time when the test contact piece comes into contact with the target chip lead to a time when the test contact piece stops moving, to adjust, based on the second data, a value of the preset reference pulse number to obtain a new value of the preset reference pulse number.

19. The chip testing system of claim 18, wherein,
the test module comprises a constant current supply module and a voltage acquisition module, an output terminal of the constant current supply module being grounded through the test contact piece, and the constant current supply module being configured to output a constant current signal;
the voltage acquisition module is connected in parallel with the test contact piece;
the voltage acquisition module is configured to collect voltage and feedback the voltage to the control module as the first data, the voltage having a first voltage value when the test contact piece is in contact with the target chip lead, and having a second voltage value when the test contact piece is not in contact with the target chip lead; and
the control module is further configured to continuously obtain the voltage collected by the voltage acquisition module, and send the stop signal to the power module when the voltage is not 0.

20. The chip testing system of claim 19, wherein,
the test contact piece includes a first finger and a second finger, a first terminal of the first finger being connected to an output terminal of the constant current supply module and a first input terminal of the voltage acquisition module, a first terminal of the second finger being connected to a second input terminal of the voltage acquisition module and grounded, a second terminal of the first finger and a second terminal of the second finger being configured to connect to the target chip lead, without being in contact with each other; and
the first finger and the second finger comprise a first conductive member, an elastically extendable component and a second conductive component connected in sequence.

21. The chip testing system of claim 19, wherein the control module is further configured to:
determine, based on the voltage fed back by the voltage acquisition module, a resistance corresponding to a target contact portion of the test contact piece when the test contact piece is in contact with the target chip lead, and when the resistance is smaller than a preset resistance threshold, determine that the target chip lead passes a height test;
determine whether each chip lead of the to-be-tested device passes the height test;
when each chip lead of the to-be-tested device passes the height test, determine that the to-be-tested device passes the height test; and
when at least one chip lead of the to-be-tested device fails the height test, determine that the to-be-tested device fails the height test.

22. The chip testing system of claim 19, wherein the control module is further configured to:
determine whether a number of uses of the test contact piece reaches a preset test threshold, and in response to the number of uses of the test contact piece reaching the preset threshold, prompt to replace the test contact piece.

23. The chip testing system of claim 19, wherein the control module is further configured to:
obtain a number of redundant pulses used by the power module corresponding to a target distance, and adjust the value of the preset reference pulse number based on the number of redundant pulses to obtain the new value of the preset reference pulse number, wherein the target distance is a distance moved by the test contact piece starting from the time when the test contact piece comes into contact with the target chip lead to the time when the test contact piece stops moving.

* * * * *